United States Patent
Kuo et al.

(10) Patent No.: US 7,242,231 B2
(45) Date of Patent: Jul. 10, 2007

(54) PROGRAMMABLE FRACTIONAL-N CLOCK GENERATORS

(75) Inventors: Shu-Chang Kuo, Taipei County (TW); Wei-Bin Yang, Taichung County (TW); Kuo-Hsing Cheng, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 14 days.

(21) Appl. No.: 11/232,949

(22) Filed: Sep. 23, 2005

(65) Prior Publication Data

US 2006/0290392 A1 Dec. 28, 2006

(30) Foreign Application Priority Data

Jun. 22, 2005 (TW) .............................. 94120750 A

(51) Int. Cl.
*H03L 7/06* (2006.01)
(52) U.S. Cl. ...................................... 327/156; 327/291
(58) Field of Classification Search ........ 327/147–148, 327/154–163, 291–294; 331/14, 17, 25, 331/DIG. 2; 375/373–376
See application file for complete search history.

(56) References Cited

U.S. PATENT DOCUMENTS 6,114,915 A * 9/2000 Huang et al. .................. 331/25
7,098,707 B2 * 8/2006 Starr et al. .................. 327/147

* cited by examiner

*Primary Examiner*—Linh My Nguyen
(74) *Attorney, Agent, or Firm*—Birch, Stewart, Kolasch & Birch, LLP

(57) ABSTRACT

Clock generators capable of generating clocks with different frequency according to a binary code. A voltage controlled oscillation module generates a plurality of first clocks ($D_0$~$D_m$) with a first frequency (f0), in which the first clocks $D_i$ and $D_{i-1}$ have a fixed phase difference and $1<i<m$. A logic control circuit outputs a set of corresponding clocks arranged in a corresponding sequence according to the first clocks and a binary code. A clock synthesizer generates a second clock with a second frequency (f1) according to the set of corresponding clocks, in which f1=A/B f0, A<B and A and B are positive integers.

26 Claims, 18 Drawing Sheets

| Time | (duty cycle) | Time | (duty cycle) |
|------|--------------|------|--------------|
| 1/2  | 51.08 %      | 4/5  | 52.51 %      |
| 1/3  | 49.92 %      | 1/6  | 51.45 %      |
| 2/3  | 48.55 %      | 1/7  | 51.28 %      |
| 1/4  | 51.25 %      | 2/7  | 49.93 %      |
| 1/5  | 50.07 %      | 4/7  | 51.40 %      |
| 2/5  | 48.30 %      | 1/8  | 50.28 %      |

FIG. 11

PROGRAMMABLE FRACTIONAL-N CLOCK GENERATORS

BACKGROUND OF THE INVENTION

1. Field of the Invention

The invention relates to clock generators, and more particularly, to clock generators capable of generating clocks with different frequency according to a binary code.

2. Brief Description of the Prior Art

Fractional-N (% N) clock generators are widely applied to microprocessors and communication systems. The conventional fractional-N clock generators, however, not only have jitters and inaccuracy in their duty cycle but also require a large chip area.

SUMMARY OF THE INVENTION

Embodiments of Clock generators are disclosed. A voltage controlled oscillation module generates a plurality of first clocks ($D_0$~$D_m$) with a first frequency (f0), in which the first clocks $D_i$ and $D_{i-1}$ have a fixed phase difference and 1<i<m. A logic control circuit outputs a set of corresponding clocks arranged by a corresponding sequence according to the first clocks and a binary code. A clock synthesizer generates a second clock with a second frequency (f1) according to the set of corresponding clocks, in which $$f1 = \frac{A}{B}f0,$$

A<B and A and B are positive integers.

The invention also discloses embodiments of phase-locked loops, in which a voltage controlled oscillation module generates a plurality of first clocks ($D_0$~$D_m$) with a first frequency (f0), wherein the first clocks $D_i$ and $D_{i-1}$ have a fixed phase difference and 1<i<m. A logic control circuit outputs a set of corresponding clocks arranged by a corresponding sequence according to the first clocks and a binary code. A clock synthesizer generates a second clock with a second frequency (f1) according to the set of corresponding clocks, wherein $$f1 = \frac{A}{B}f0,$$

A<B and A and B are positive integers. A phase-frequency detector generates a control signal according to a phase difference between the second clock and a reference clock. A charge pump receives the control signal and generates a control voltage by a low pass filter to control the voltage controlled oscillation module.

The invention also discloses embodiments of clock generation methods, in which a plurality of first clocks (D0~Dm) with a first frequency (f0) is generated, wherein the first clocks $D_i$ and $D_{i-1}$ have a fixed phase difference and 1<i<m. A set of corresponding clocks arranged by a corresponding sequence is output according to the first clocks and a binary code. A second clock with a second frequency (f1) is synthesized according to the set of corresponding clocks, wherein $$f1 = \frac{A}{B}f0,$$

A<B and A and B are positive integers.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the subsequent detailed description and the accompanying drawings, which are given by way of illustration only, and thus are not limitative of the present invention, and wherein:

FIG. 11 is a relational table of the duty cycle and time of the clock generator.

DETAILED DESCRIPTION OF THE PREFERRED EMBODIMENTS

Figure 1A:
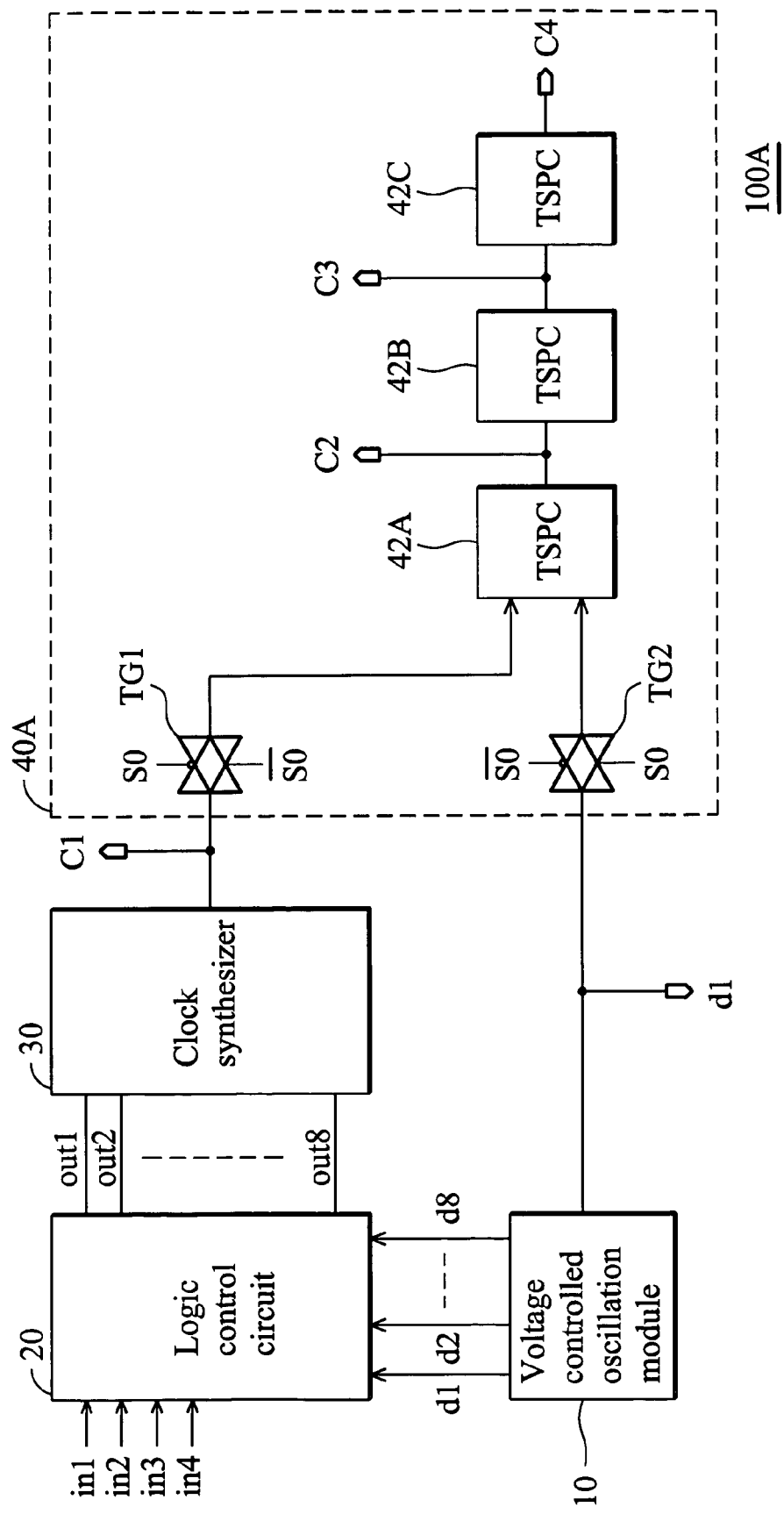
FIG. 1A shows an embodiment of a clock generator.

FIG. 1A shows an embodiment of a clock generator. As shown, the clock generator 100A comprises a voltage controlled oscillation module 10, a logic control circuit 20, a clock synthesizer 30 and a frequency divider 40A.

The voltage controlled oscillation module 10 generates a plurality of clocks d1~d8 with a first frequency (f0). In clocks d1~d8, there is a fixed phase difference phase between each clock and the next clock.

The logic control circuit 20 outputs a set of corresponding clocks arranged by a corresponding sequence according to the clocks d1~d8 and a binary code. For example, the binary code can be a four-bit code (in1~in4), but it is to be understood that the invention is not limited thereto. Furthermore, the logic control circuit 20 also generates a control signal S0 and outputs to the frequency divider 40A according to the binary code in1~in4. The voltage controlled oscillation module 10, for example, can be a phase-locked loop (PLL).

The clock synthesizer 30 is coupled to the logic control circuit 20 to generate a clock C1 with a second frequency (f1) according to the set of corresponding clocks from the logic control circuit 20, in which $$f1 = \frac{A}{B}f0,$$

A<B and A and B are positive integers. The frequency divider 40A selectively receives the clock C1 from the clock synthesizer 30 or the clock d1 from the voltage controlled oscillation module 10 according to the control signal S0 from the logic control circuit 20. The frequency divider 40A divides the received clock (C1 or d1) by $2^N$ and outputs the divided clock, in which N is positive integer and N>1. As shown, frequency divider 40A comprises three true single-phase circuits (TSPC) 42A~42C connected in series, but it is to be understood that the invention is not limited thereto.

When the frequency divider 40A receives the clock C1 with a frequency f1 from the clock synthesizer 30, the TSPC 42A outputs a clock C2 with a frequency of $$\frac{1}{2}f1,$$

the TSPC 42B outputs a clock C3 with a frequency of $$\frac{1}{4}f1$$

and the TSPC 42C outputs a clock C4 with a frequency of $$\frac{1}{8}f1.$$

When the frequency divider 40A receives the clock d1 with the frequency f0 from the voltage controlled oscillation module 10, the TSPC 42A outputs a clock C2 with a frequency of $$\frac{1}{2}f0,$$

the TSPC 42B outputs a clock C3 with a frequency of $$\frac{1}{4}f0$$

and the TSPC 42C outputs a clock C4 with a frequency of $$\frac{1}{8}f0.$$

Figure 2:
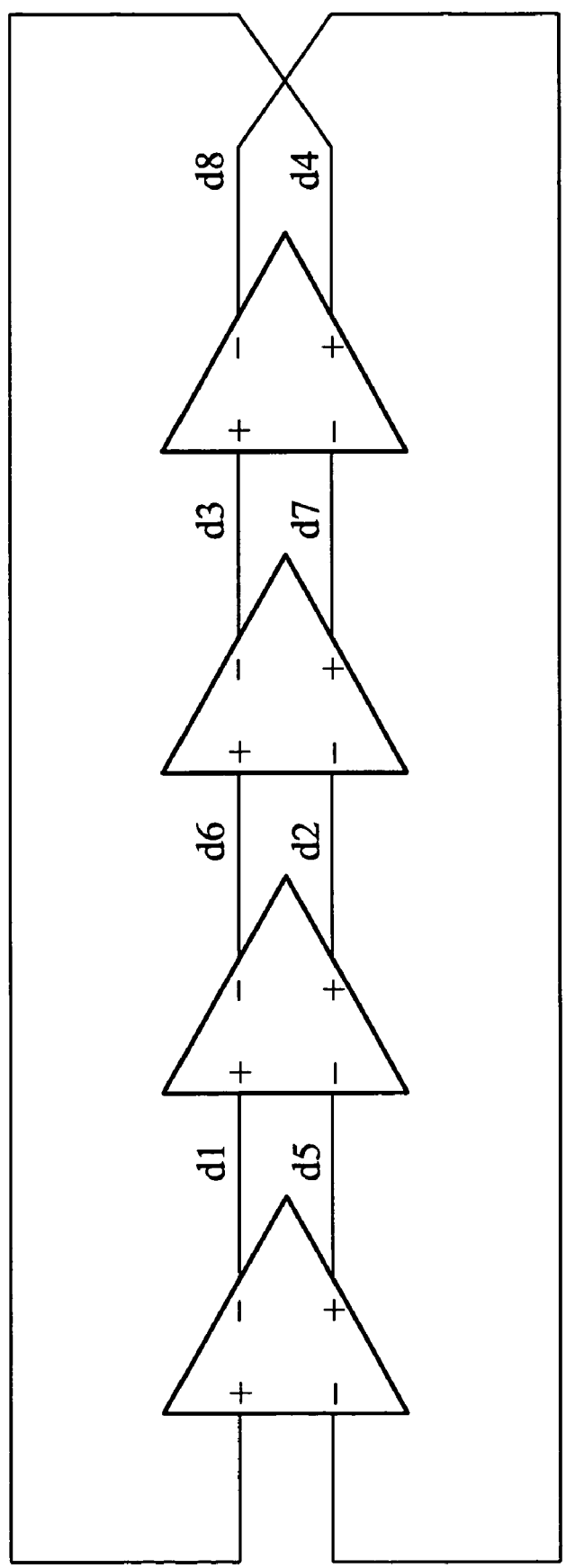
FIG. 2 shows an embodiment of a voltage controlled oscillation module.
Figure 3:
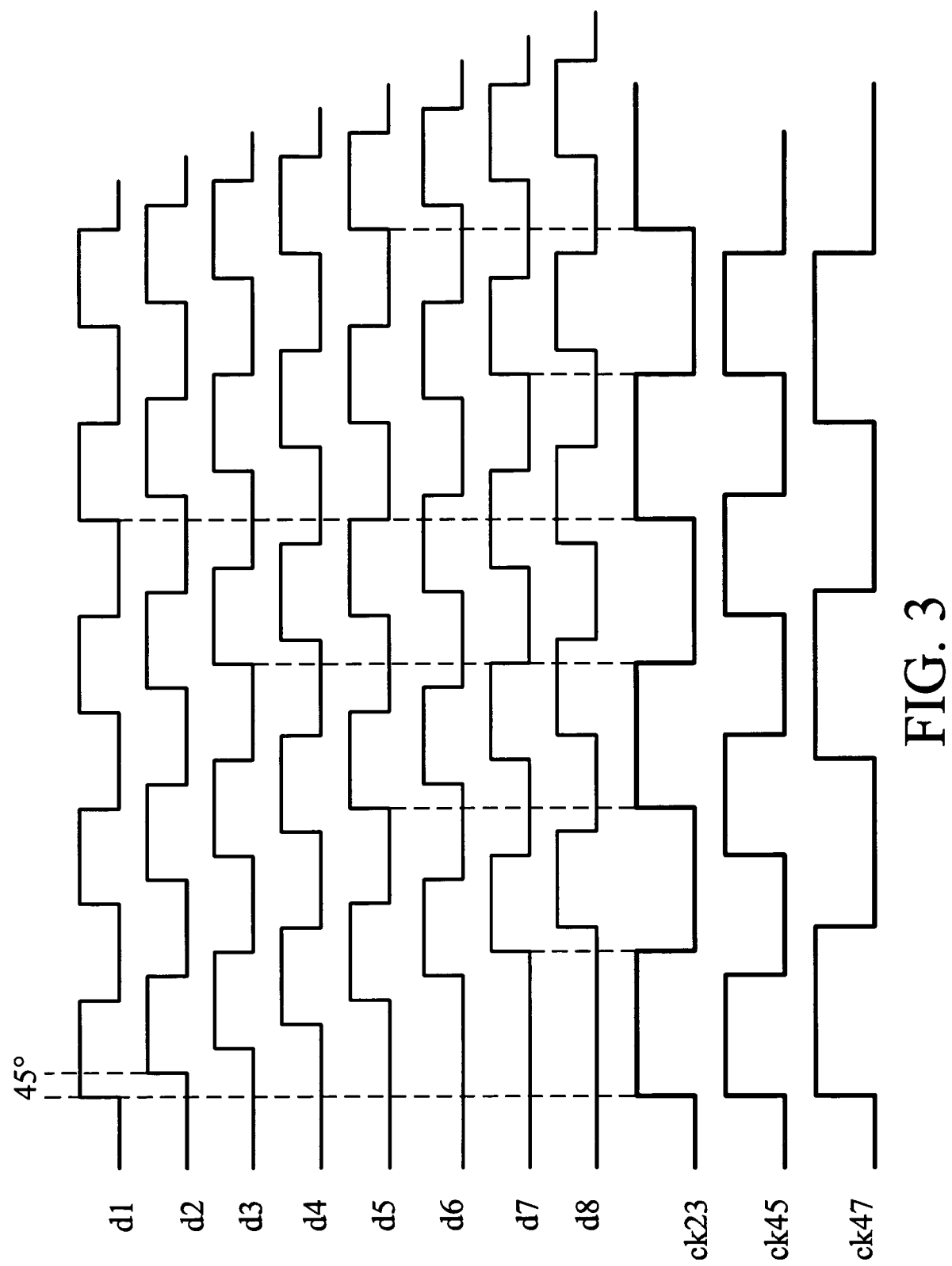
FIG. 3 is a timing chart of the clocks output from the voltage controlled oscillation module.

FIG. 2 shows an embodiment of a voltage controlled oscillation module. As shown, the voltage controlled oscillation module comprises 4 stages of voltage controlled oscillators connected in series, generating clocks d1~d8 with the same frequency. FIG. 3 is a timing chart of the clocks output from the voltage controlled oscillation module. As shown, in clocks d1~d8, there is a fixed phase difference between the each clock and the next clock. For example, there is a phase difference of 45° between the clocks d1 and d2, between the clocks d2 and d3, and so on.

Figure 4A:
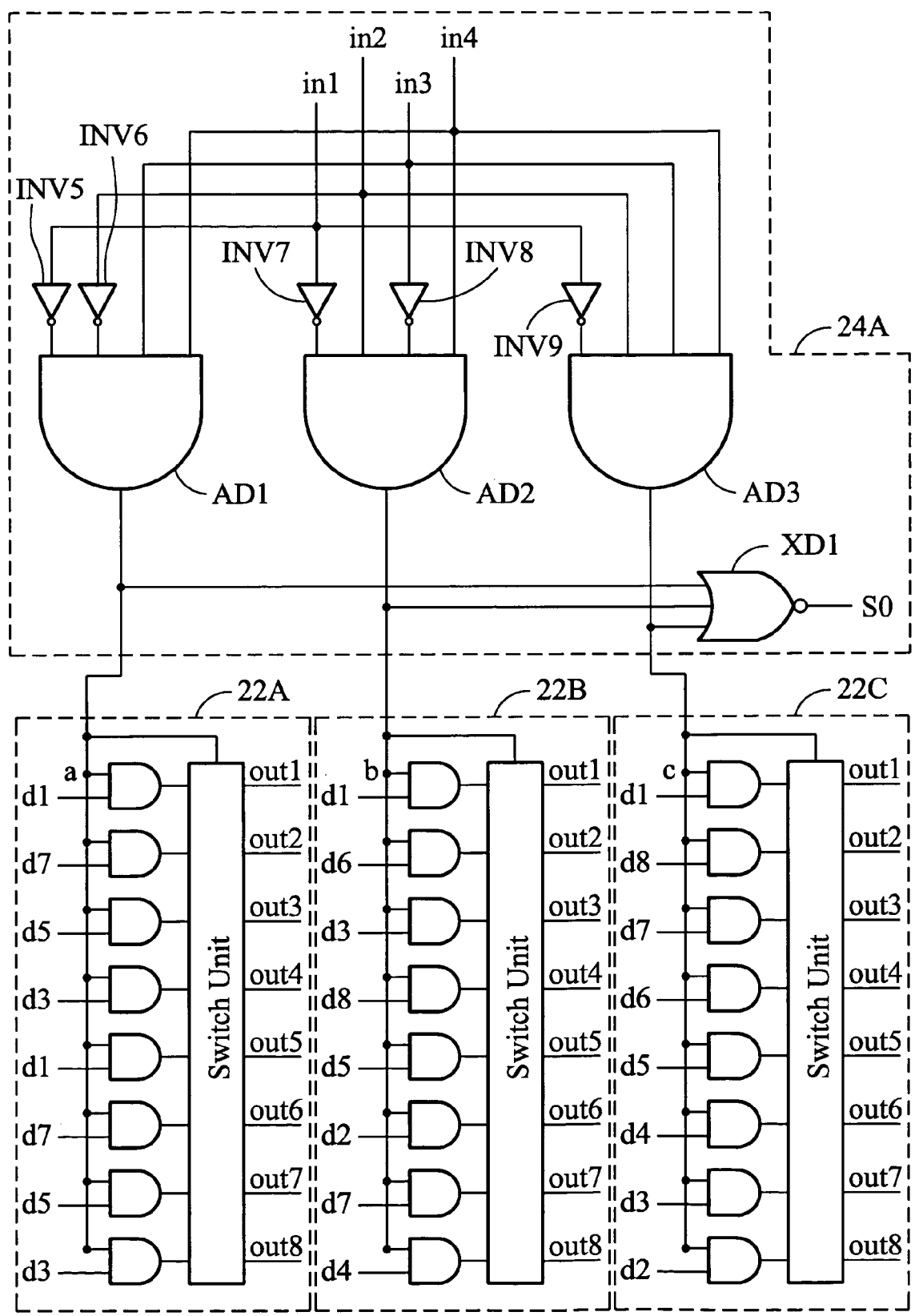
FIG. 4A shows an embodiment of a logic control circuit.

FIG. 4A shows an embodiment of a logic control circuit. As shown, the logic control circuit 20A comprises three transfer units 22A~22C and a logic unit 24A. The logic unit 24A comprises three AND gates AD1~AD3, five inverters INV5~INV9 and a NOR gate XD1, generating control signals a, b, c and S0 according to the binary code in1~in4. The transfer units 22A~22C each comprise eight AND gates and a switch unit comprising eight transmission gates (not shown), outputting the received clock according to the control signal a, b and c from the transfer unit 22A. Input terminals of the transfer unit 22A are coupled to the clocks d1, d7, d5, d3, d1, d7, d5 and d3 respectively, input terminals of the transfer unit 22B are coupled to the clocks d1, d6, d3, d8, d5, d2, d7 and d4 respectively, and input terminals of the transfer unit 22C are coupled to the clocks d1, d8, d7, d6, d5, d4, d3 and d2 respectively. Namely, the transfer units 22A~22C receive clocks d1~d8 from the voltage controlled oscillation module 10, and output clocks arranged in a different sequence. For example, the transfer unit 22A outputs clocks arranged in a first sequence (d1→d7→d5→d3→d1→d7→d5→d3), the transfer unit 22B outputs clocks arranged in a second sequence (d1→d6→d3→d8→d5→d2→d7→d4) and the transfer unit 22A outputs clocks arranged in a third sequence (d1→d8→d7→d6→d5→d4→d3→d2).

In this embodiment, when the decimal value of the binary code in1~in4 equals 3, the transfer unit 22A outputs the received clocks d1, d7, d5, d3, d1, d7, d5 and d3 to the clock synthesizer 30 through output terminals out1~out8 according to the control signal a. When the decimal value of the binary code in1~in4 equals 5, the transfer unit 22B outputs the received clocks d1, d6, d3, d8, d5, d2, d7 and d4 to the clock synthesizer 30 through output terminals out1~out8 according to the control signal b.

When the decimal value of the binary code in1~in4 equals 7, the transfer unit 22C outputs the received clocks d1, d8, d7, d6, d5, d4, d3 and d2 to the clock synthesizer 30 through output terminals out1~out8 according to the control signal c. If the decimal value of the binary code in1~in4 equals $2^N$, the transfer units 22A~22C are disabled and do not output the received clocks to the clock synthesizer 30. At this time, the frequency divider 40A receives the clock d1 from the voltage controlled oscillation module 10 according to the control signal S0.

Figure 5A:
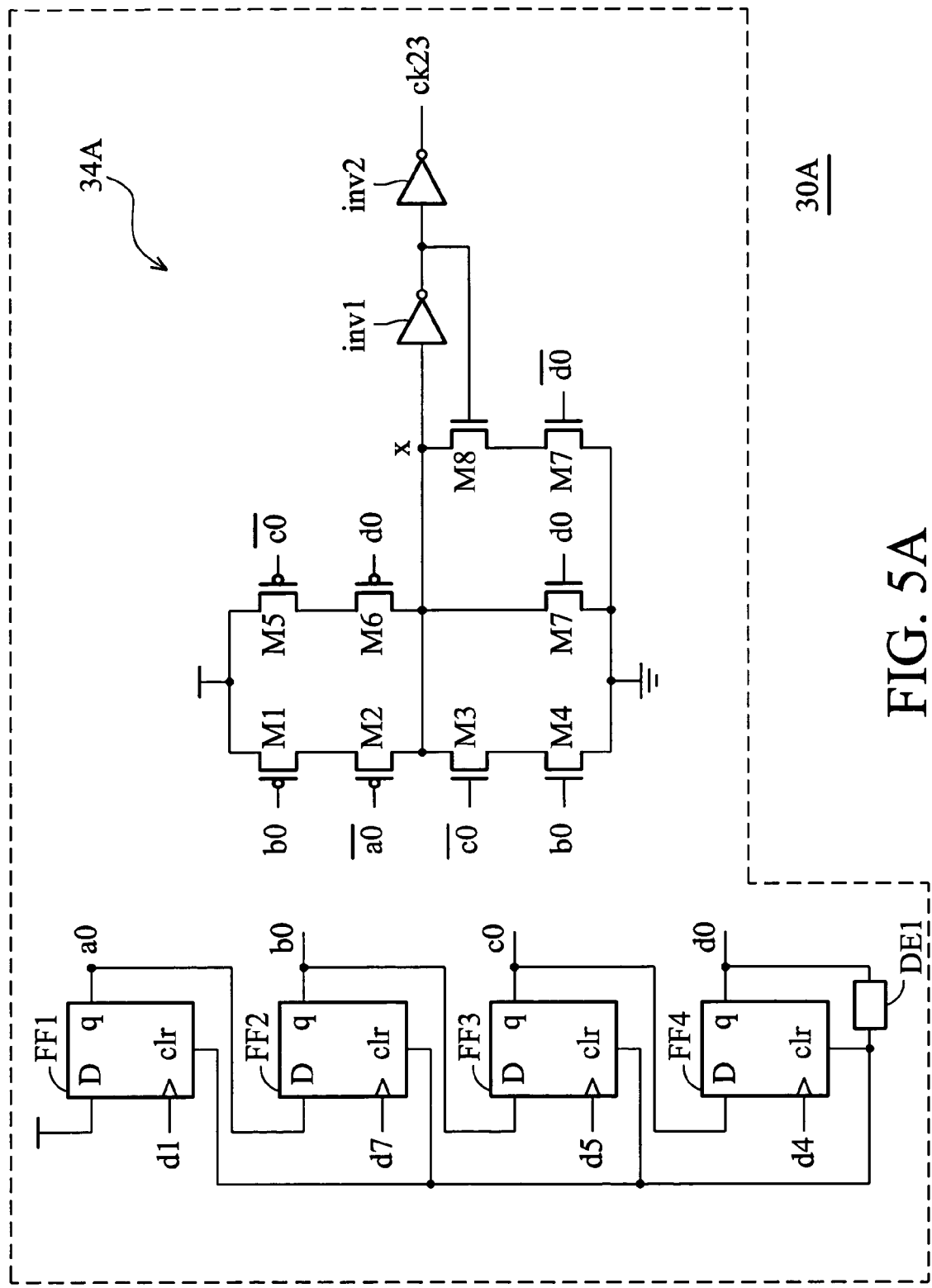
FIG. 5A shows an embodiment of a clock synthesizer.

FIG. 5A shows an embodiment of a clock synthesizer. FIG. 6 is a timing chart of the clock synthesizer shown in FIG. 5. As shown in FIG. 5, the clock synthesizer 30A comprises D flip-flops FF1~FF4 connected in series and a clock generation unit 34A.

Enable terminals of the D flip-flops FF1~FF4 are coupled to clocks d1, d7, d5 and d3, and clear terminals of the D flip-flops FF1~FF4 are coupled to a delay element DE1. The output terminal of the D flip-flops FF1 is coupled to input terminal of the D flip-flops FF2, output terminal of the D flip-flops FF2 is coupled to input terminal of the D flip-flops FF3, output terminal of the D flip-flops FF3 is coupled to input terminal of the D flip-flops FF4, output terminal of the D flip-flops FF4 is coupled to input terminal of the delay element DE1. The delay element DE1 resets all D flip-flops FF1~FF4 according to the output signal d0 from the D flip-flops FF1. The clock generation unit 34A comprises transistor M1~M9 and inverter INV1~INV2.

Operation of the clock synthesizer 30A is described with reference to FIGS. 5 and 6. At time t1, the clock d1 goes high and signal a0 goes high. Because signals b0~d0 all stay low and only the signal a0 stays high, the voltage at the node x is pulled high due to turn on of the transistors M1 and M2, such that the output clock ck32 goes high.

At time t2, the clock d7 goes high and signal b0 goes high. Because signals c0 and d0 stay low and the signals a0 and b0 stay high, the voltage at the node x is pulled low due to turn on of the transistors M3~M4 and M8~M9, such that the output clock ck32 goes low.

At time t3, the clock d5 goes high and signal c0 goes high. Because only signal d0 stays low and the signals a0~c0 stay high, the voltage at the node x is pulled high due to turn on of the transistors M5 and M6, such that the output clock ck32 goes high again.

At time t4, the clock d3 goes high and signal d0 goes high. Because signals a0~d0 all stay high, the voltage at the node x is pulled low due to turn on of the transistor M7, such that the output clock ck32 goes low again. The delay element DE1 delays the signal d1 for a time interval and outputs to the clear terminals of all D flip-flops FF1~FF4. It should be noted that signals $\overline{a0}$~$\overline{d0}$ are inversion signals of the signals a0~d0.

At time t5, the clear terminals of all D flip-flops FF1~FF4 are pulled high, such that all signals a0~d0 go low. Namely, due to the clocks d1, d7, d5 and d3, the D flip-flops FF1~FF4 outputs signals a0~d0 as trigger pulses in sequence, such that the clock generation unit 34A generates a clock with a frequency $$\frac{A}{B}f0.$$

In this embodiment, because of fixed phase difference between the clocks d1, d3, d5 and d7 and the specific received sequence, the clock synthesizer 30 can generate the clock ck23 with a frequency of $$\frac{2}{3}f0$$

according to racing edges of the clocks d1, d3, d5 and d7.

Figure 5B:
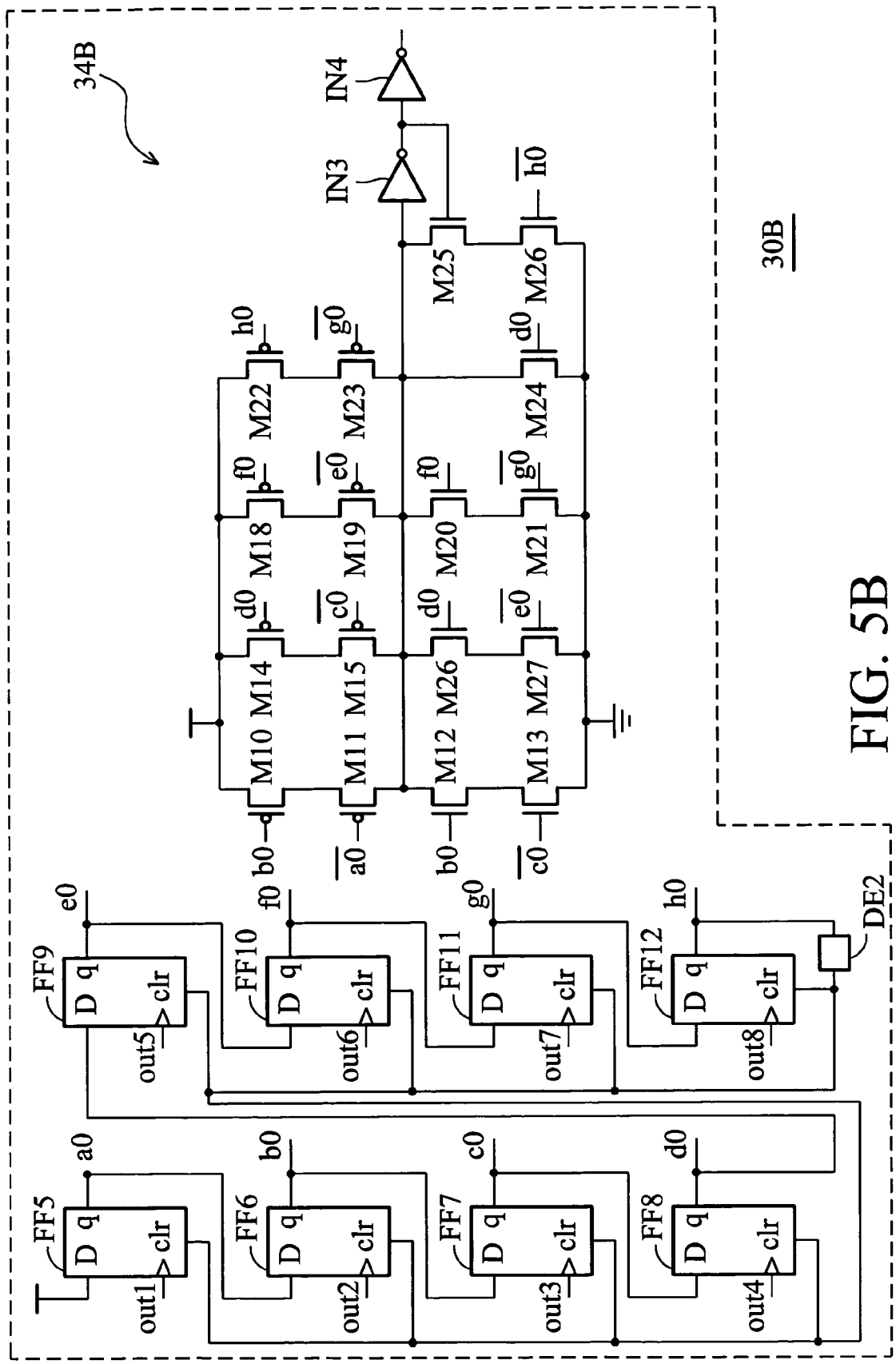
FIG. 5B shows another embodiment of the clock synthesizer.
Figure 6:
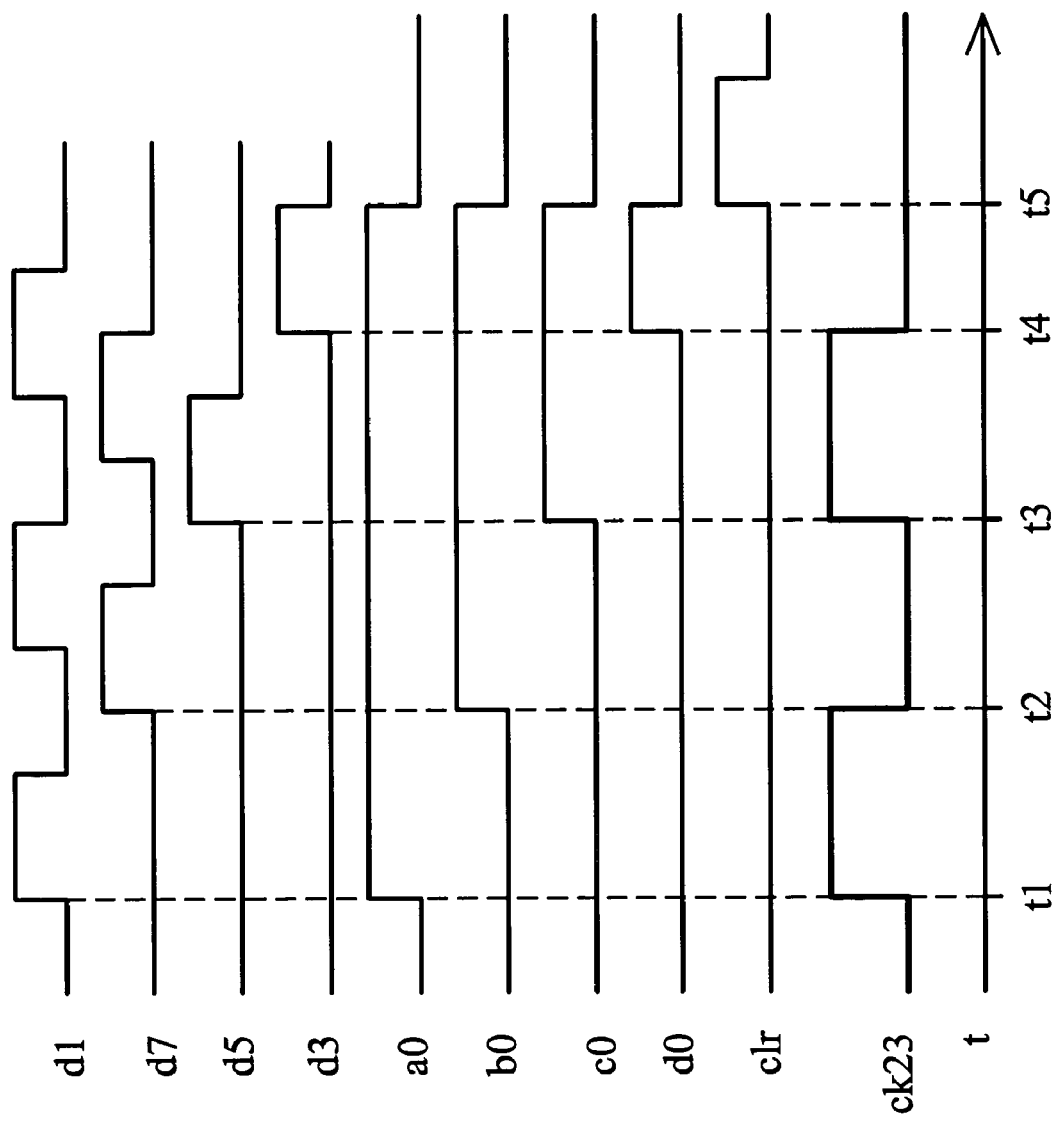
FIG. 6 is a timing chart of the clock synthesizer.

FIG. 5B shows another embodiment of the clock synthesizer. As shown, clock synthesizer 30B comprises a plurality of D flip-flops FF5~FF12 connected in series and a clock generation unit 34B.

Enable terminals of the D flip-flops FF5~FF12 are coupled to the output terminals out1~out8 of the logic control circuit 20, and clear terminals of the D flip-flops FF5~FF12 are coupled to a delay element DE2. Output terminal of the D flip-flops FF5 is coupled to input terminal of the D flip-flops FF6, output terminal of the D flip-flops FF6 is coupled to input terminal of the D flip-flops FF7, and so on. Output terminal of the D flip-flops FF12 is coupled to input terminal of the delay element DE2, and the delay element DE2 resets all D flip-flops FF5~FF12 according to the output signal from the D flip-flops FF12. The clock generation unit 34A comprises transistor M10~M26 and inverter INV3~INV4. It should be noted that signals $\overline{a0}$~$\overline{h0}$ are inversion signal of the signals a0~h0.

Operation of the clock synthesizer 30B is similar to that of clock synthesizer 30A shown in FIG. 5, and thus is omitted for simplification. It should be note that the clock synthesizer 30B generates the clock ck23 with a frequency of $$\frac{2}{3}f0$$

when receiving clocks d1, d7, d5, d3, d1, d7, d5 and d3 from the transfer unit 22A. Alternately, the clock synthesizer 30B generates the clock ck45 with a frequency of $$\frac{4}{5}f0$$

as shown in FIG. 3 when receiving clocks d1, d6, d3, d8, d5, d2, d7 and d4 from the transfer unit 22B. The clock synthesizer 30B generates the clock ck47 with a frequency of $$\frac{4}{7}f0$$

as shown in FIG. 3 when receiving clocks d1, d8, d7, d6, d5, d4, d3 and d2 from the transfer unit 22C.

Figure 7:
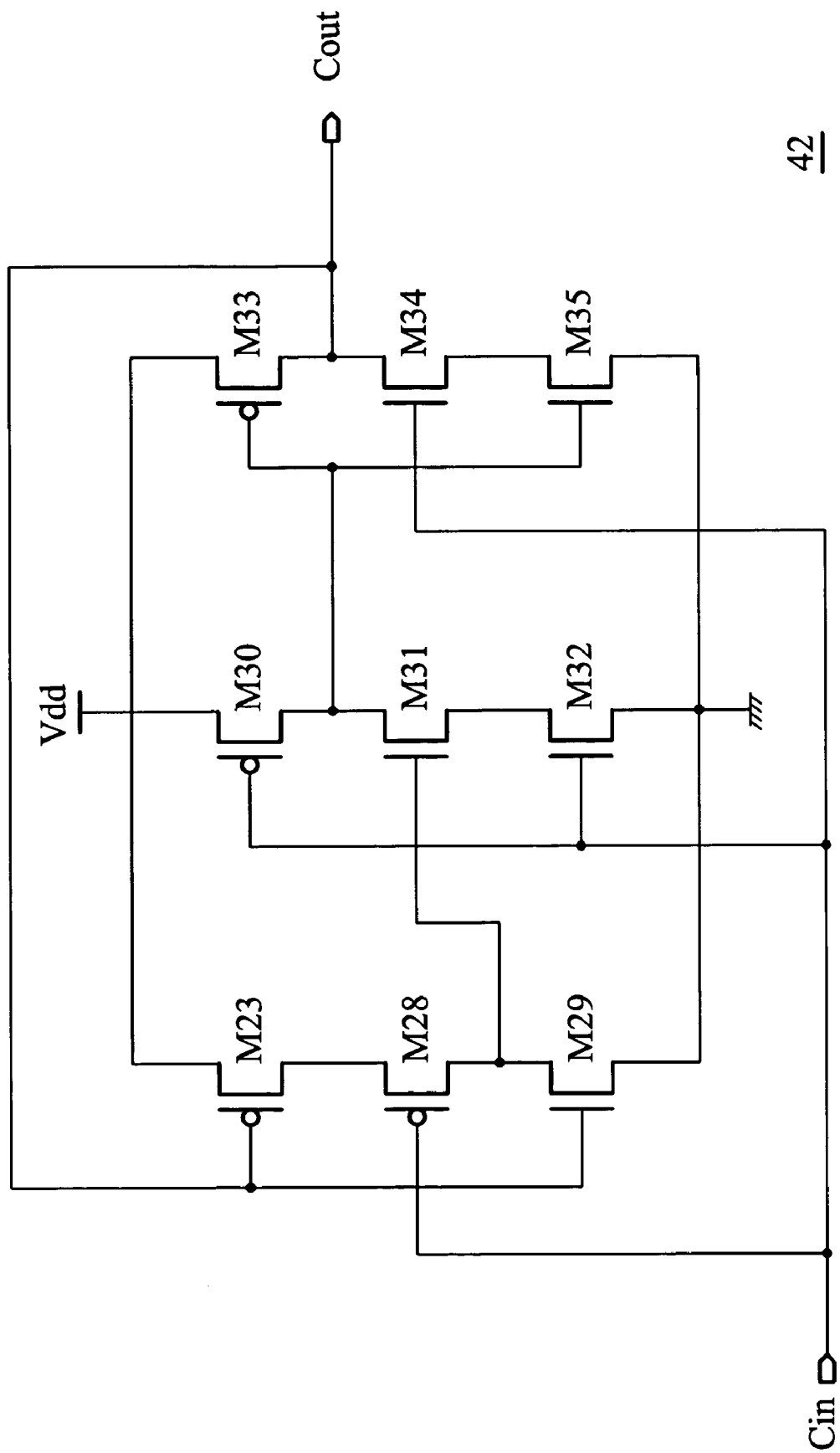
FIG. 7 shows an embodiment of the true single-phase circuit (TSPC)

FIG. 7 shows an embodiment of the true single-phase circuit (TSPC). As shown, the TSPC 42 comprises transistor M27~M35, receiving an input clock Cin with a frequency fin to output an output clock Cout with a frequency of $$\frac{1}{2}fin.$$

Further, the TSPC 42 would output the output clock Cout at 50% duty cycle.

When the binary code in1~in4 are 0010, the logic control circuit 20A disables the transfer units 22A~22C, and the frequency divider 40A receives the clock d1 and outputs a clock C2 with a frequency of $$\frac{1}{2}f0,$$

a clock C3 with a frequency of $$\frac{1}{4}f0$$

and a clock C4 with a frequency of $$\frac{1}{8}f0.$$

Figure 8A:
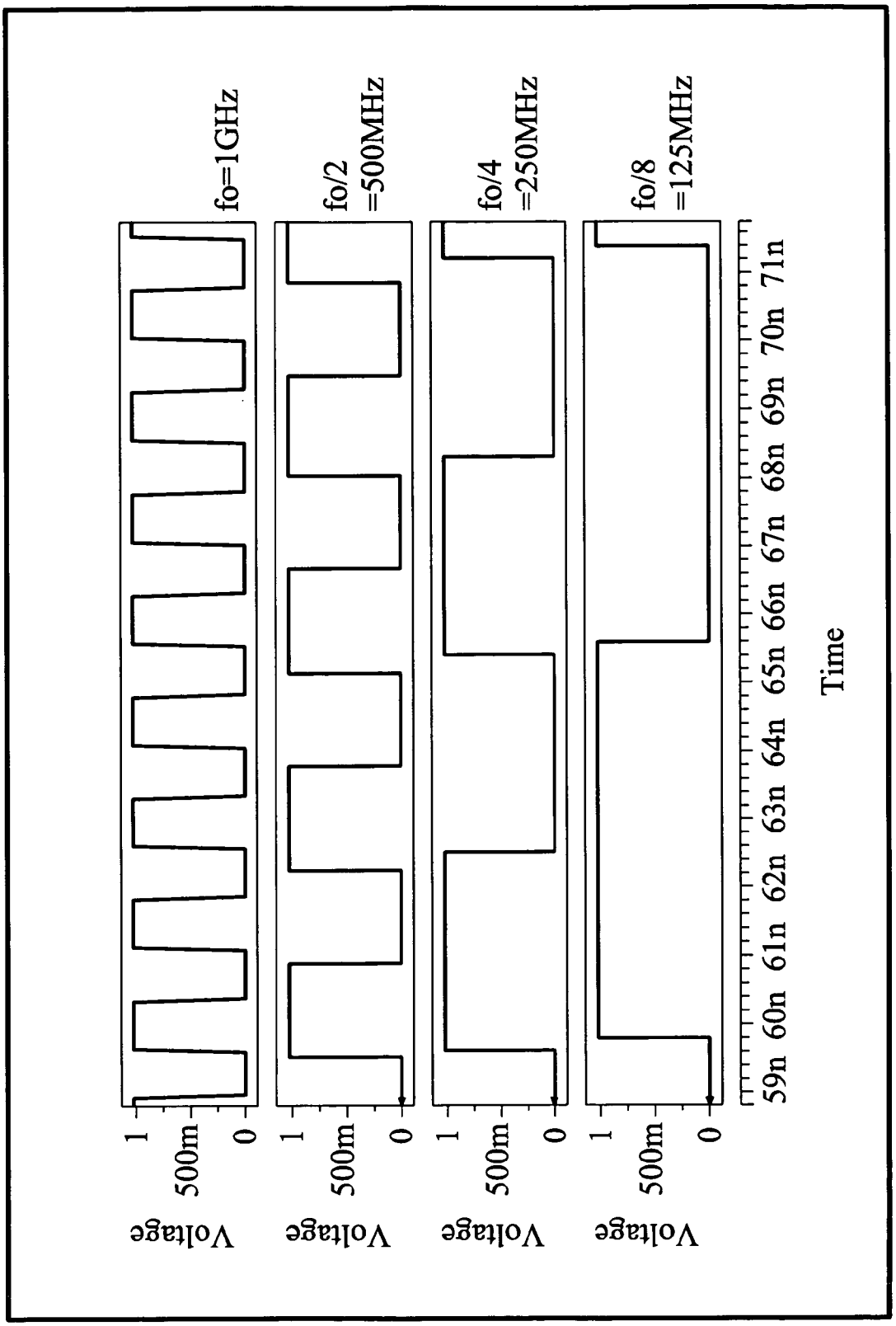
FIGS. 8A~8D are output waves of the clock generator shown in FIG. 1A under different binary codes.

For example, if the frequency of the clocks d1~d8 is 1 GHz, the frequencies of the clocks C2~C4 are 500 MHz, 250 MHz and 125 MHz respectively, as shown in FIG. 8A.

When the binary code in1~in4 are 0011, the transfer units 22A outputs clocks d1, d7, d5, d3, d1, d7, d5 and d3, such that the clock synthesizer 30 outputs a clock C1 with a frequency of $$\frac{2}{3}f0.$$

Accordingly, the frequency divider 40A receives the clock d1 and outputs a clock C2 with a frequency of $$\frac{1}{3}f0,$$

a clock C3 with a frequency of $$\frac{1}{6}f0$$

and a clock C4 with a frequency of $$\frac{1}{12}f0.$$

Figure 8B:
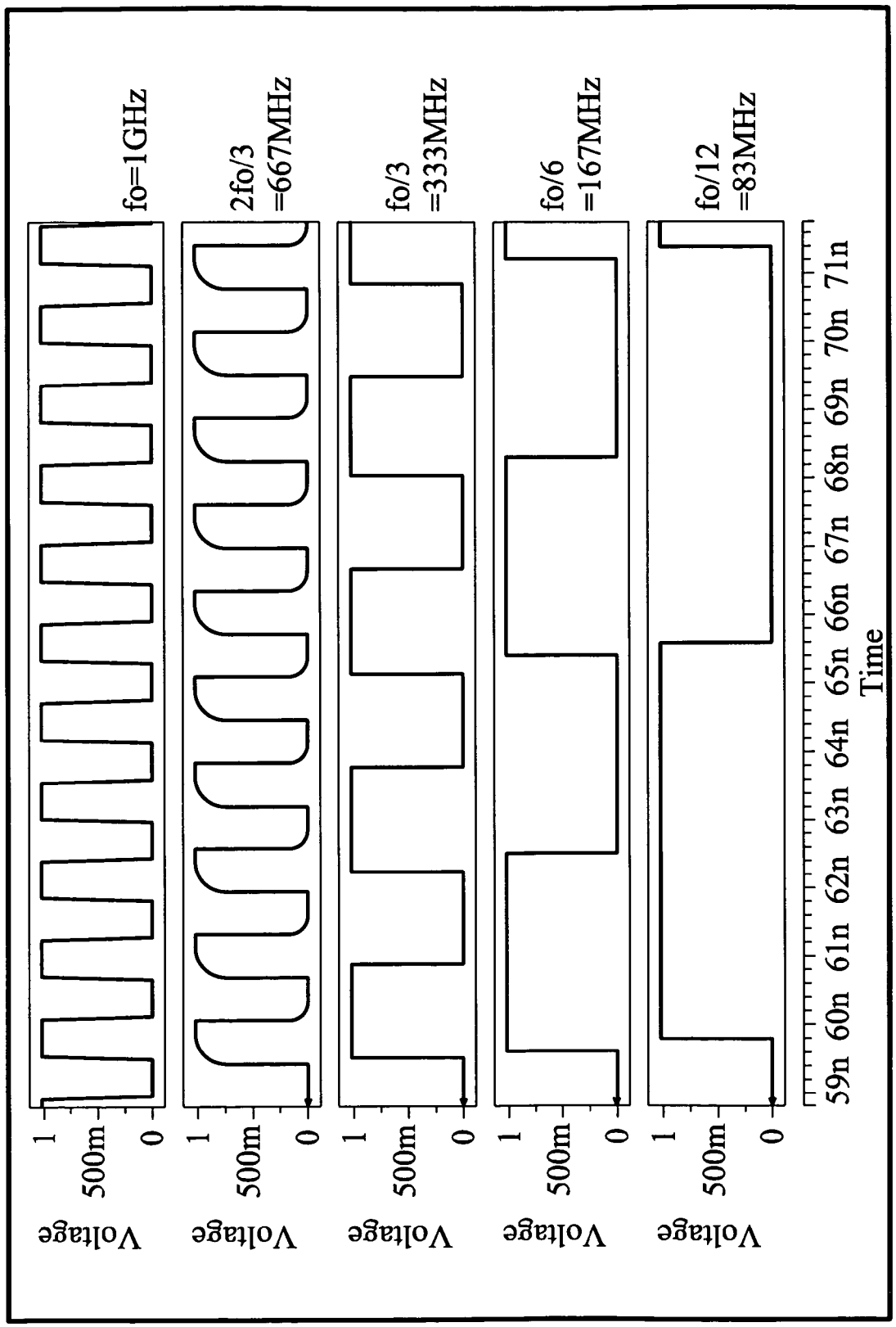

For example, if the frequency of the clocks d1~d8 is 1 GHz, the frequencies of the clocks C1~C4 are 677 MHz, 333 MHz, 167 MHz and 83 MHz respectively, as shown in FIG. 8B.

When the binary code in1~in4 are 0101, the transfer units 22B outputs clocks d1, d6, d3, d8, d5, d2, d7 and d4, such that the clock synthesizer 30 outputs a clock C1 with a frequency of $$\frac{4}{5}f0.$$

Accordingly, the frequency divider 40A receives the clock d1 and outputs a clock C2 with a frequency of $$\frac{2}{5}f0,$$

a clock C3 with a frequency of $$\frac{1}{5}f0$$

and a clock C4 with a frequency of $$\frac{1}{10}f0.$$

Figure 8C:
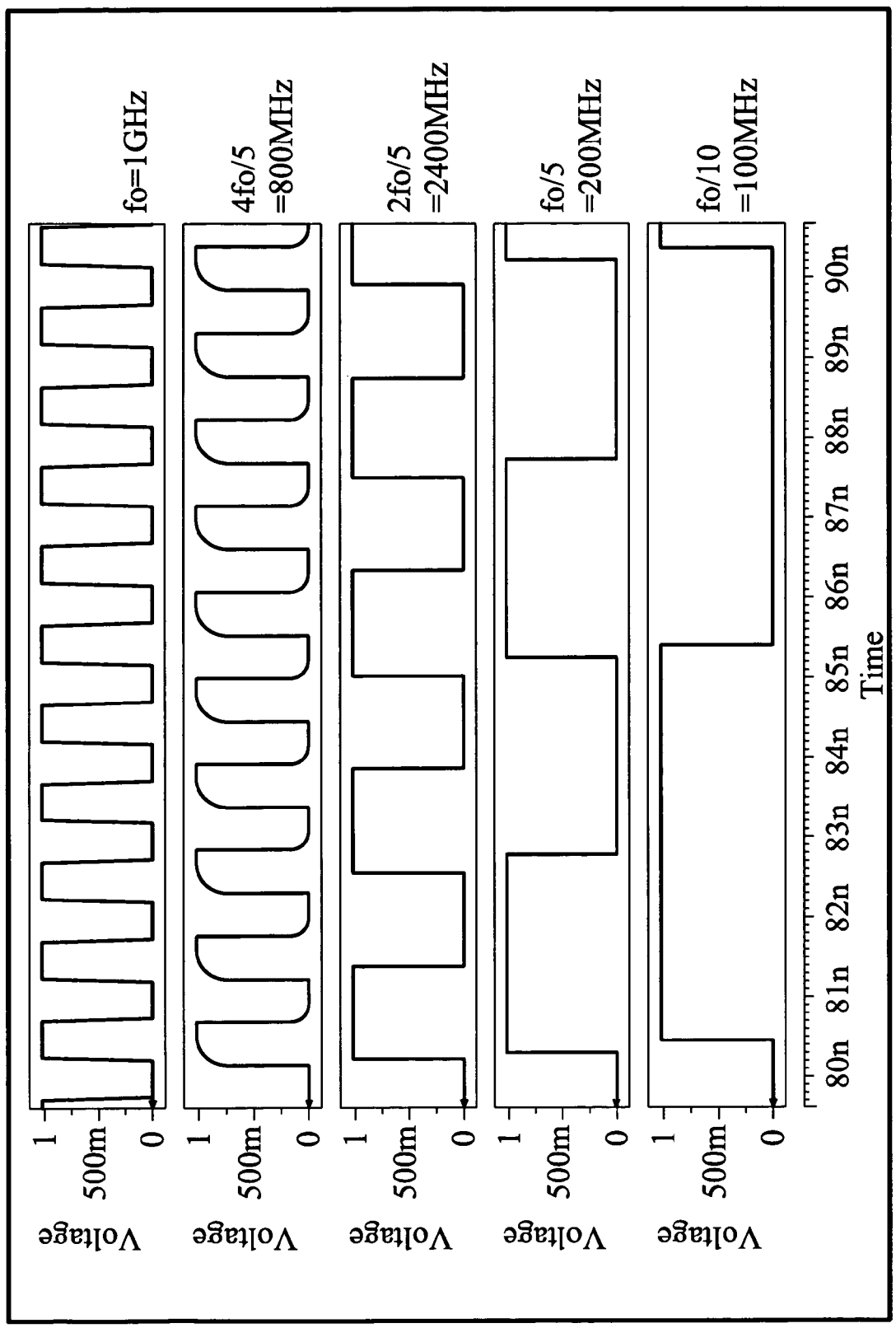

For example, if the frequency of the clocks d1~d8 is 1 GHz, the frequencies of the clocks C1~C4 are 800 MHz, 400 MHz, 200 MHz and 100 MHz respectively, as shown in FIG. 8C.

When the binary code in1~in4 are 0111, the transfer units 22C outputs clocks d1, d8, d7, d6, d5, d4, d3 and d2, such that the clock synthesizer 30 outputs a clock C1 with a frequency of $$\frac{4}{7}f0.$$

Accordingly, the frequency divider 40A receives the clock d1 and outputs a clock C2 with a frequency of $$\frac{2}{7}f0,$$

a clock C3 with a frequency of $$\frac{1}{6}f0$$

and a clock C4 with a frequency of $$\frac{1}{7}f0.$$

Figure 8D:
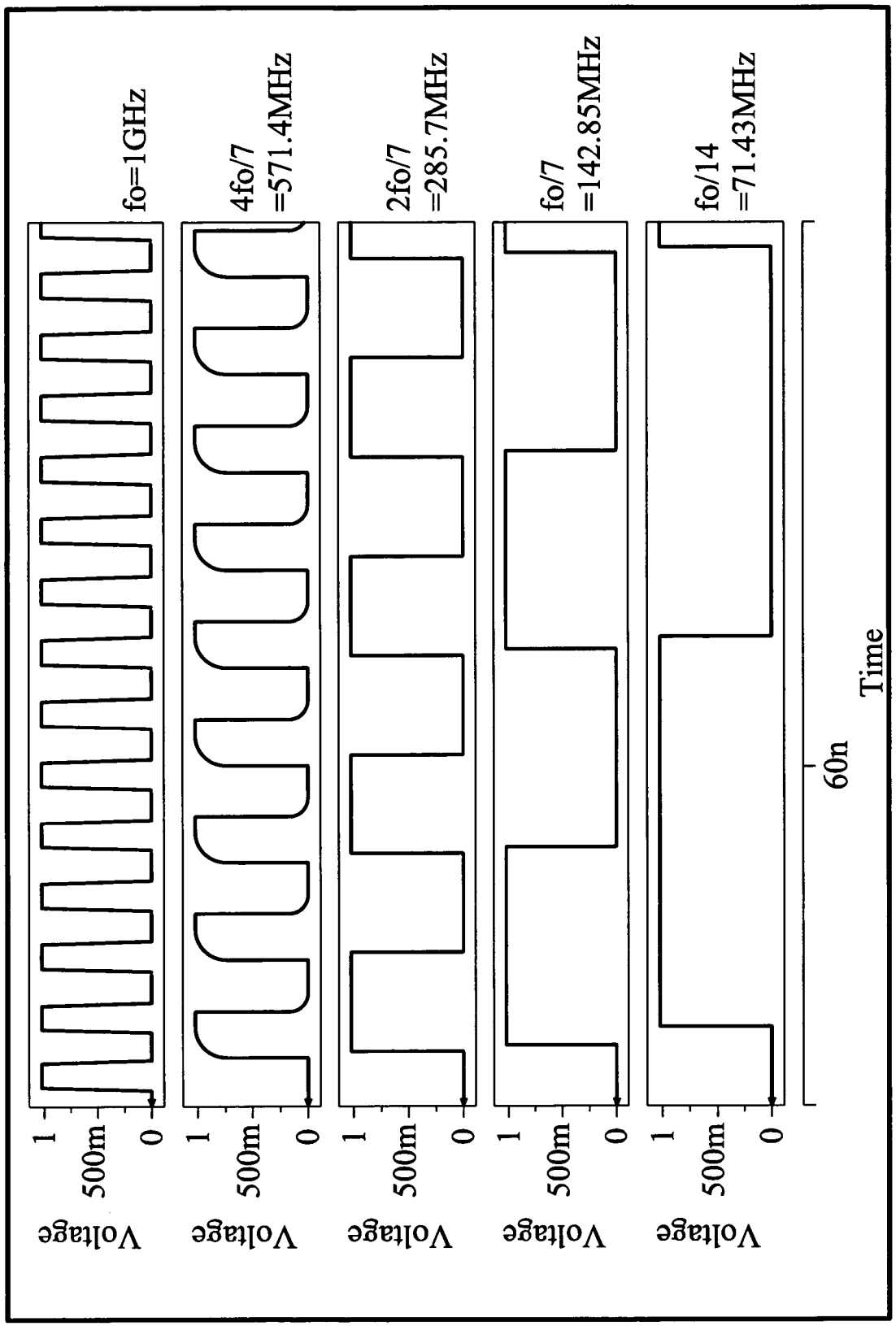

For example, if the frequency of the clocks d1~d8 is 1 GHz, the frequencies of the clocks C1~C4 are 571.4 MHz, 285.7 MHz, 142.85 MHz and 71.43 MHz respectively, as shown in FIG. 8D.

Figure 1B:
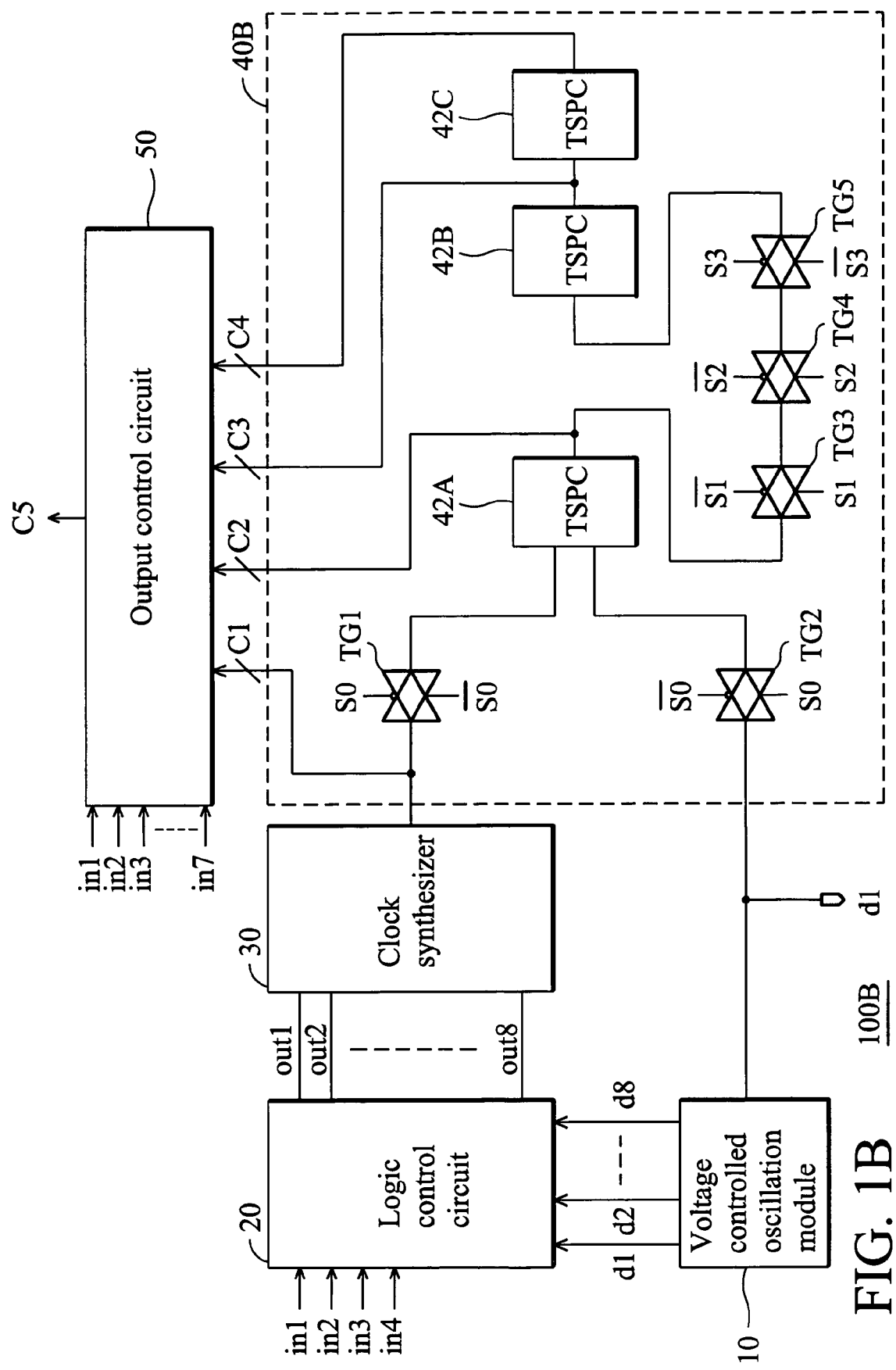
FIG. 1B shows another embodiment of the clock generator.

FIG. 1B shows another embodiment of the clock generator. As shown, the clock generator 100B is similar to that shown in FIG. 1A, exception of the logic control circuit 20, the frequency divider 40 and an output control circuit 50. The output control circuit 50 selectively outputs clocks C2~C4 to serve as an output clock C5 according to the binary code in1~in7.

Figure 4B:
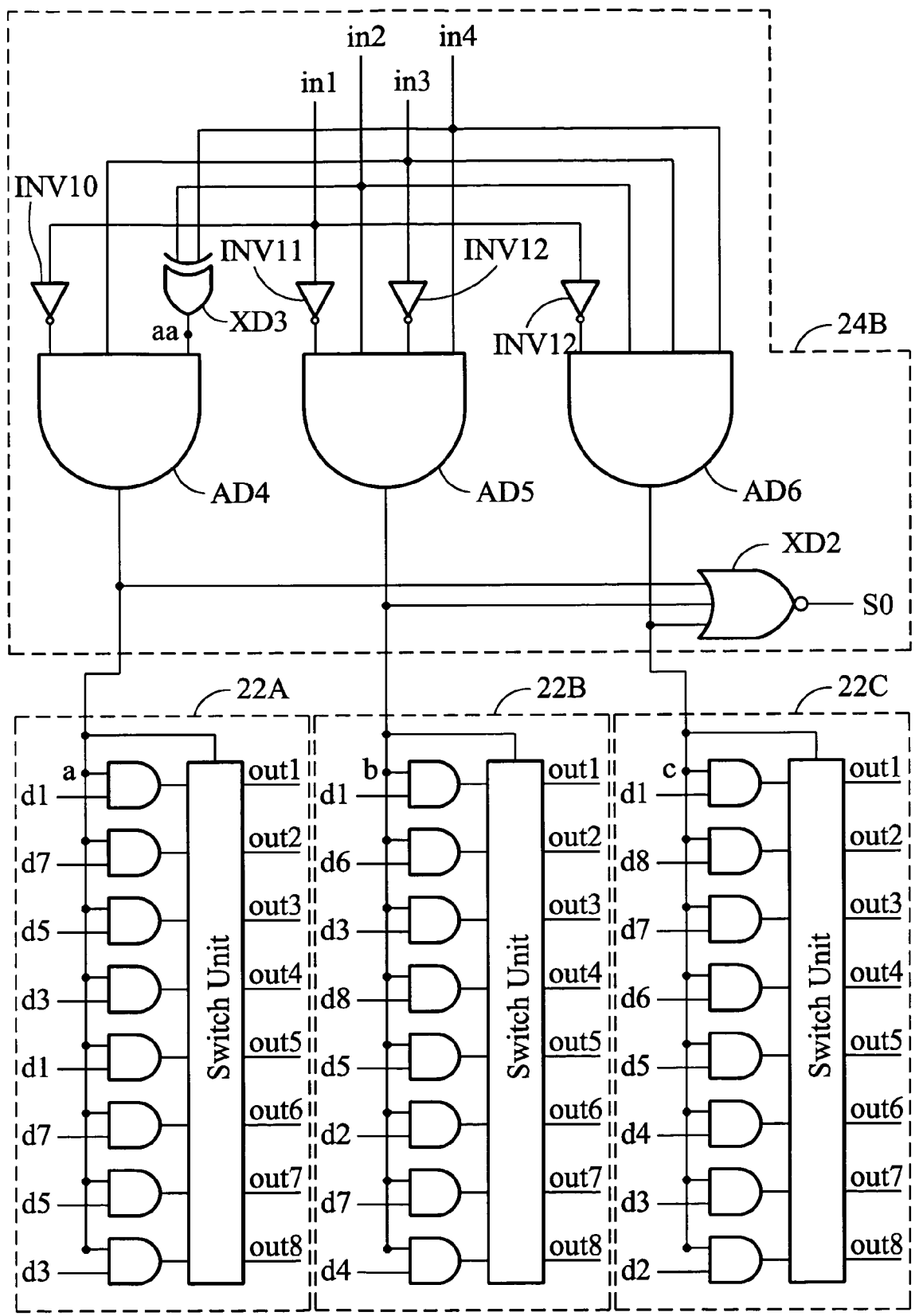
FIG. 4B shows another embodiment of the logic control circuit.

FIG. 4B shows another embodiment of the logic control circuit. As shown, the logic control circuit 20B comprises three transfer units 22A~22C and a logic unit 24B, in which the transfer units 22A~22C is similar to those shown in FIG. 4, and thus, description thereof is omitted for simplification.

The logic unit 24B comprises three AND gates AD4~AD6, four inverters INV10~INV13, a XOR gate XOR1, and NOR gate XD2, generating control signals a, aa, b, c and S0 according to the binary code in1~in4.

In this embodiment, when the decimal value of the binary code in1~in4 equals 3, the transfer unit 22A outputs the received clocks d1, d7, d5, d3, d1, d7, d5 and d3 to the clock synthesizer 30 through output terminals out1~out8 according to the control signal a. When the decimal value of the binary code in1~in4 equals 5, the transfer unit 22B outputs the received clocks d1, d6, d3, d8, d5, d2, d7 and d4 to the clock synthesizer 30 through output terminals out1~out8 according to the control signal b.

When the decimal value of the binary code in1~in4 equals 7, the transfer unit 22C outputs the received clocks d1, d8, d7, d6, d5, d4, d3 and d2 to the clock synthesizer 30 through output terminals out1~out8 according to the control signal c.

If the decimal value of the binary code in1~in4 equals $2^N$, the transfer units 22A~22C are disabled and do not output the received clocks to the clock synthesizer 30. At this time, the frequency divider 40B receives the clock d1 from the voltage controlled oscillation module 10 according to the control signal S0.

As shown, frequency divider 40B comprises three series-connected TSPC 42A~42C and five transmission gates TG1~TG5, in which the transmission gates TG1~TG2 are controlled by signals S0 and the transmission gates TG3~TG5 are controlled by signals S1~S3.

Figure 9:
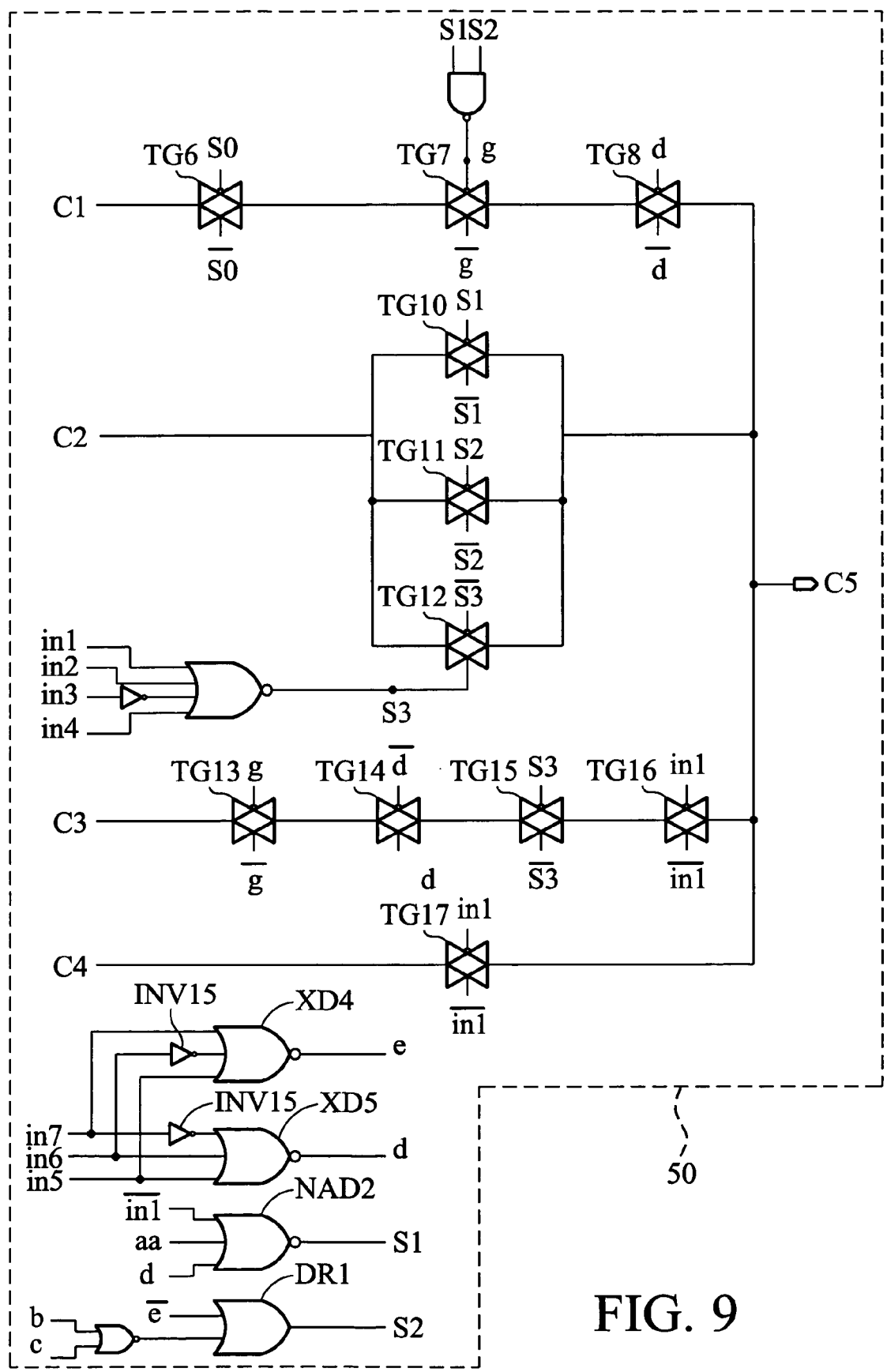
FIG. 9 shows an embodiment of an output control circuit.

FIG. 9 shows an embodiment of an output control circuit. As shown, the output control circuit 50 comprises transmission gates TG6~TG17, NAND gates NAD1~NAD2, inverters INV14~INV16 and XOR gates XD4~XD7. The output control circuit 50, according to the binary code in1~in7, outputs clocks C1, C2, C3 or C4 to serve as the output clock C5 and generates signals S1~S3 to output to the frequency divider 40B.

Signals d and e are generated according to the binary code in5~in7, signals S1 are generated according to the signals aa, b, c, d and in1. Signal S3 are generated according to the binary code in1~in4, in which signals $\overline{a}$~$\overline{b}$ and $\overline{in1}$ are inversion signals of the signals a~g and the binary code in1.

For example, when the binary code in1~in4 are 0111010, the logic control circuit 20B enables the transfer unit 22C to outputs clocks d1, d8, d7, d6, d5, d4, d3 and d2, such that clock synthesizer 30 outputs a clock C1 with a frequency of $$\frac{4}{7}f0.$$

Further, transmission gates TG3~TG5 are turned off according to the signals S1~S3, such that the clock C2 with frequency of $$\frac{2}{7}f0$$

generated by the TSPC 42A is not output to the TSPC 42B. The output control circuit 50 outputs the clock C2 with frequency of $$\frac{2}{7}f0$$

generated by the TSPC 42A to serve as the output clock C5 through the transmission gates TG10 or TG11.

Alternately, when the binary code in1~in4 are 0111 and the binary code in5~in7 are 001, the logic control circuit 20B enables the transfer unit 22C to outputs clocks d1, d8, d7, d6, d5, d4, d3 and d2, such that clock synthesizer 30 outputs a clock C1 with a frequency of $$\frac{4}{7}f0.$$

Further, the TSPC 42A generates the clock C2 with frequency of $$\frac{2}{7}f0$$

according to the clock C1. Transmission gates TG3~TG5 are turned on according to the signals S1~S3, such that the clock C2 with frequency of $$\frac{2}{7}f0$$

generated by the TSPC 42A is output to the TSPC 42B. Accordingly, the TSPC 42B generates a clock C3 with frequency of $$\frac{1}{7}f0$$

and the TSPC 42C generates a clock C4 with frequency of $$\frac{1}{14}f0.$$

The output control circuit 50 outputs the clock C2 with frequency of $$\frac{1}{7}f0$$

generated by the TSPC 42B to serve as the output clock C5 through the transmission gates TG13~TG16. If the binary code in5~in7 are 100, the transmission gates TG1~TG5 are turned off according to the signals S0~S5, such that the output control circuit 50 outputs the clock C1 with frequency of generated by the clock synthesizer 30 to serve as the output clock C5 through the transmission gates TG6~TG8.

Alternately, when the binary code in1~in4 are 0101 and the binary code in5~in7 are 001, the logic control circuit 20B enables the transfer unit 22B to outputs clocks d1, d6, d3, d8, d5, d2, d7 and d4, such that clock synthesizer 30 outputs a clock C1 with a frequency of $$\frac{4}{5}f0.$$

Further, the TSPC 42A generates the clock C2 with frequency of $$\frac{2}{5}f0$$

according to the clock C1. Transmission gates TG3~TG5 are turned on according to the signals S1~S3, such that the clock C2 with frequency of $$\frac{2}{5}f0$$

generated by the TSPC 42A is output to the TSPC 42B. Accordingly, the TSPC 42B generates a clock C3 with frequency of $$\frac{1}{5}f0$$

and the TSPC 42C generates a clock C4 with frequency of $$\frac{1}{10}f0.$$

The output control circuit 50 outputs the clock C2 with frequency of $$\frac{1}{5}f0$$

generated by the TSPC 42B to serve as the output clock C5 through the transmission gates TG13~TG16. If the binary code in5~in7 are 100, the transmission gates TG1~TG5 are turned off according to the signals S0~S5, such that the output control circuit 50 outputs the clock C1 with frequency of $$\frac{4}{5}f0$$

generated by the clock synthesizer 30 to serve as the output clock C5 through the transmission gates TG6~TG8.

Figure 10:
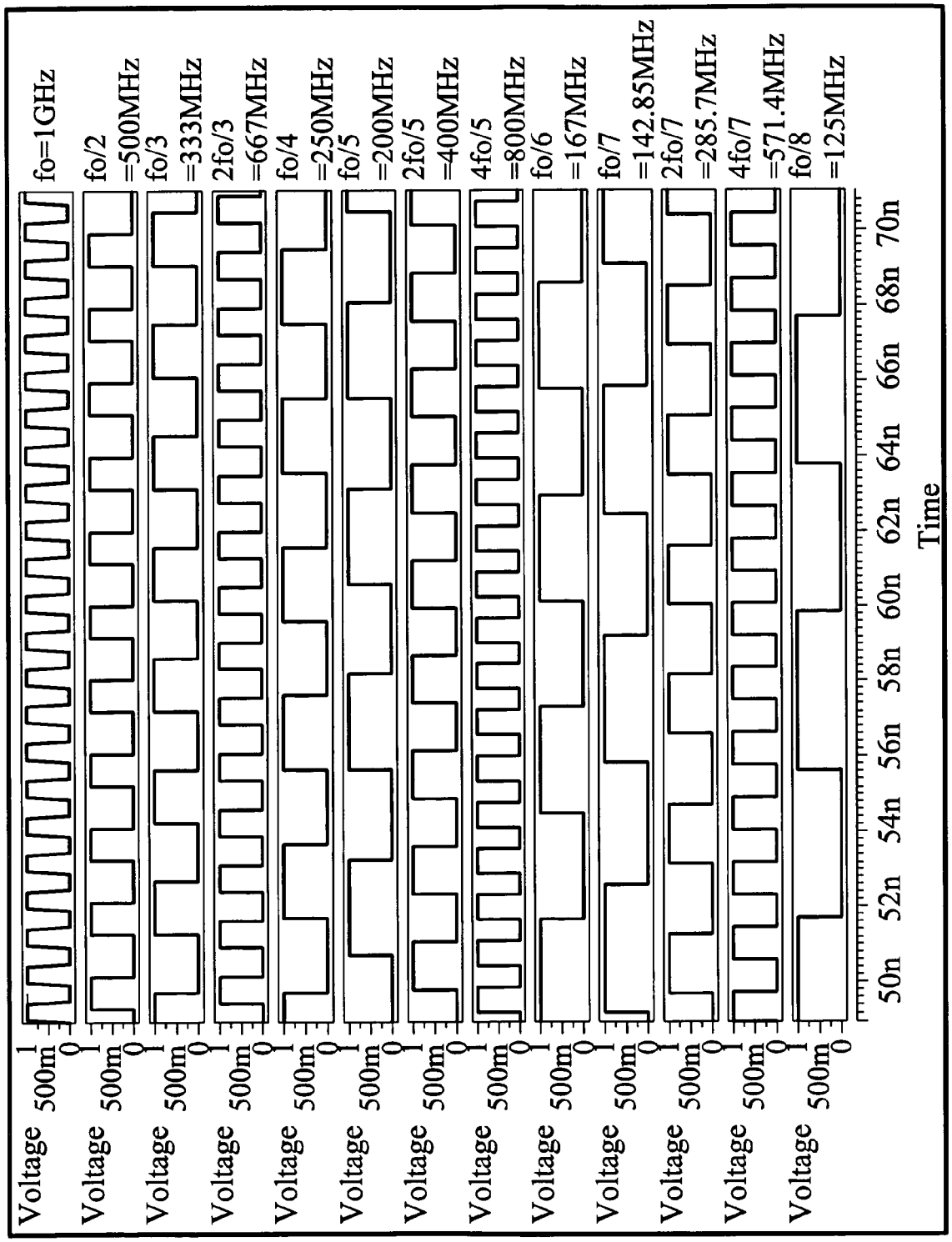
FIG. 10 is output wave of the clock generator shown in FIG. 1B under different binary codes.

FIG. 10 is the output wave of the clock generator shown in FIG. 1B under different binary codes. For example, the frequency of the clocks d1~d8 is f0 (1 GHz), the frequencies of the output clock C5 are $$\frac{1}{2}f0$$

(500 MHz), $$\frac{1}{3}f0$$

(333 MHz), $$\frac{2}{3}f0$$

(667 MHz), $$\frac{1}{4}f0$$

(250 MHz), $$\frac{1}{5}f0$$

(200 MHz), $$\frac{2}{5}f0$$

(400 MHz), $$\frac{4}{5}f0$$

(800 MHz), $$\frac{1}{6}f0$$

(167 MHz), $$\frac{1}{7}f0$$

(142.85 MHz), $$\frac{2}{7}f0$$

(285.7 MHz), $$\frac{4}{7}f0$$

(571.4 MHz) and $$\frac{1}{8}f0$$

(125 MHz), when the binary codes (in1~in7) are 0010001, 0011001, 0011010, 0100001, 0101010, 0101100, 0110010, 0111001, 0111010, 0111100, 1000001.

FIG. 11 is a relational table of the duty cycle and time of the clock generator. As shown, the clock generator can obtain a duty cycle close to 50% under different times, thus, the clock generators of the invention are suitable for system on chip technology.

Figure 12:
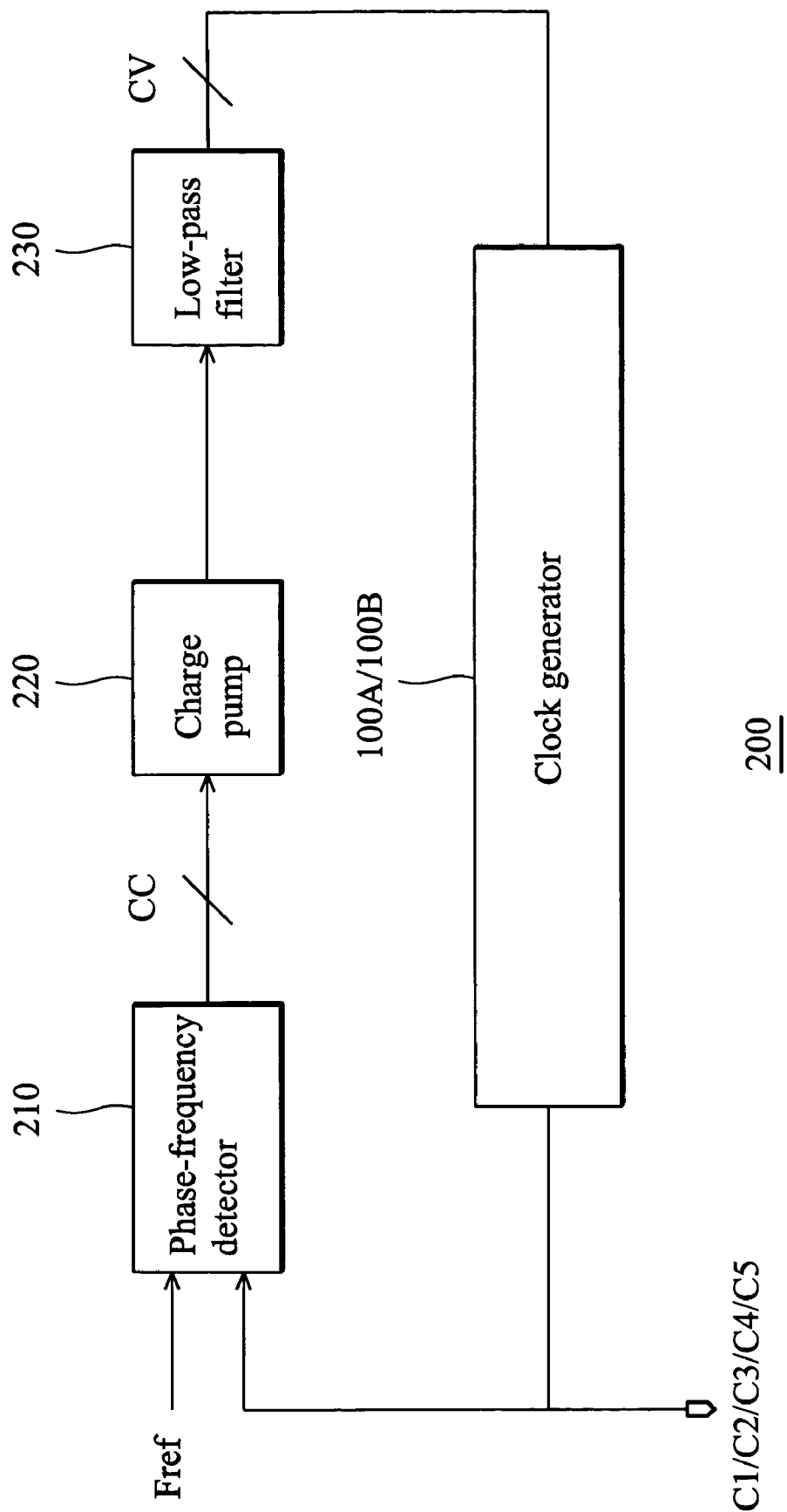
FIG. 12 shows an embodiment of a phase locked loop.

The invention also discloses a phase locked loop shown in FIG. 12. As shown, the phase locked loop 200 comprises a phase-frequency detector 210, a charge pump 220, a low-pass filter 230 and the described clock generator 100A/100B, in which operation and structure of the clock generator 100A/100B are similar to that of the first and second embodiments, and thus, description thereof is omitted for simplification.

The phase-frequency detector 210 generates a control signal CC according to a phase difference between the clock generated by the clock generator 100a/100B and a reference clock Fref. For example, the clock generator 100A can generate clocks C1~C4 with different frequencies according to binary code in1~in4. The clock generator 100B can generate a clock C5 with a corresponding frequency according to the binary code in1~in7. The phase-frequency detector 210 generates the control signal CC according to a phase difference between the clock C1, C2, C3, C4 or C5 generated by the clock generator 100A/100B and a reference clock Fref.

The charge pump receives the control signal CC and generating a control voltage CV by a low pass filter 230 to control the voltage controlled oscillation module 10 in the clock generator 100A/100B. Thus, phase locked loop 200 is not affected by noise generated by high speed or high frequency.

The invention also discloses a clock generation method.

First, a plurality of clocks d1~d8 with the same frequency is generated by a voltage controlled oscillation module or a phase locked loop. In clocks d1~d8, there is a fixed phase difference between each clock and the next clock. For example, as shown in FIG. 3, there is a phase difference of 45° between the clocks d1 and d2 and between the clocks d2 and d3, and so on.

Next, a set of corresponding clocks arranged by a corresponding sequence is output according to the clocks d1~d8 and a binary code.

For example, when the decimal value of the binary code in1~in4 equals 3, the transfer unit 22A outputs the received clocks d1, d7, d5, d3, d1, d7, d5 and d3 to the clock synthesizer 30 through output terminals out1~out8 according to the control signal a. When the decimal value of the binary code in1~in4 equals 5, the transfer unit 22B outputs the received clocks d1, d6, d3, d8, d5, d2, d7 and d4 to the clock synthesizer 30 through output terminals out1~out8 according to the control signal b. When the decimal value of the binary code in1~in4 equals 7, the transfer unit 22C outputs the received clocks d1, d8, d7, d6, d5, d4, d3 and d2 to the clock synthesizer 30 through output terminals out1~out8 according to the control signal c. The clocks output form the transfer units 22A, 22B or 22C are input to a clock synthesizer 30.

A clock C1 with a frequency (f1) is synthesized according to the clocks output from the transfer unit 22A, 22B or 22C, wherein $$f1 = \frac{A}{B}f0,$$

A<B and A and B are positive integers. For example, a clock ck23 with a frequency of $$\frac{2}{3}f0$$

is generated by the clock synthesizer 30B when receiving clocks d1, d7, d5, d3, d1, d7, d5 and d3 from the transfer unit 22A. Alternately, a clock ck45 with a frequency of $$\frac{4}{5}f0$$

as shown in FIG. 3 is generated by the clock synthesizer 30B when receiving clocks d1, d6, d3, d8, d5, d2, d7 and d4 from the transfer unit 22B. Alternately, a clock ck47 with a frequency of $$\frac{4}{7}f0$$

as shown in FIG. 3 is generated by the clock synthesizer 30B when receiving clocks d1, d8, d7, d6, d5, d4, d3 and d2 from the transfer unit 22C.

If the decimal value of the binary code in1~in4 equals $2^N$, such as 2, 4, 8, and so on, the transfer units 22A~22C are disabled and do not output the received clocks to the clock synthesizer 30. At this time, the clock d1 from the voltage controlled oscillation module 10 is input to the frequency divider 40A to generate a clock with a frequency f2, according to the control signal S0, in which $$f2 = \frac{1}{2^N}f0$$

and N is positive integer.

In the embodiments, the clock synthesizer can synthesize clocks with frequency of $$\frac{2}{3}f0, \frac{4}{5}f0$$

and $$\frac{4}{7}f0$$

according to clocks generated by four series-connected voltage controlled oscillators. In some examples, the clock synthesizer can synthesize clocks with frequency of $$\frac{3}{4}f0, \frac{3}{5}f0$$

and $$\frac{3}{7}f0$$

according to clocks generated by three or six series-connected voltage controlled oscillators. Alternately, the clock synthesizer can synthesize clocks with frequency of $$\frac{5}{6}f0$$

and $$\frac{5}{7}f0$$

according to clocks generated by five series-connected voltage controlled oscillators. Similarly, the clock synthesizer can synthesize clocks with frequency of $$\frac{6}{7}f0$$

according to clocks generated by sixth series-connected voltage controlled oscillators, but it is to be understood that the invention is not limited thereto. Thus, the clock generation method of the invention can generate different clocks with different frequency according to different binary codes.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A clock generator, comprising:
 a voltage controlled oscillation module, generating a plurality of first clocks ($D_0$~$D_m$) with a first frequency (f0), wherein the first clocks $D_i$ and $D_{i-1}$ have a fixed phase difference and 1<i<m;
 a logic control circuit, outputting a set of corresponding clocks arranged by a corresponding sequence according to the first clocks and a binary code;
 a clock synthesizer generating a second clock with a second frequency (f1) according to the set of corresponding clocks, wherein $$f1 = \frac{A}{B}f0,$$

A<B and A and B are positive integers, and
 a frequency divider receiving the second clock and one of the first clocks selectively and generating a third clock with a third frequency (f2), wherein $$f2 = \frac{1}{2^N}f0,$$

N is a positive integer and N>1.

2. The clock generator as claimed in claim 1, wherein the decimal value of the binary code equals B.

3. The clock generator as claimed in claim 2, wherein B is odd integer and B>1.

4. The clock generator as claimed in claim 2, wherein B is even integer excluding from $2^N$ and N is positive integer and N>1.

5. The clock generator as claimed in claim 1, wherein the frequency divider generates a fourth clock with a fourth frequency (f3) when receiving one of the first clock, $$f3 = \frac{1}{2^N}f0,$$

N is positive integer and N>1.

6. The clock generator as claimed in claim 1, wherein the frequency divider comprises at lease one true single phase circuit (TSPC).

7. The clock generator as claimed in claim 5, wherein the frequency divider receives one of the first clocks to generate the fourth clock when the decimal value of the binary code equals $2^N$.

8. The clock generator as claimed in claim 1, wherein the clock synthesizer comprises:
   a plurality of D flip-flops connected in series, comprising a plurality of input terminals coupled to the corresponding clocks to generate a plurality of trigger pulses in sequence; and
   a clock generation unit outputting the second clock with the second frequency according to the trigger pulses.

9. The clock generator as claimed in claim 1, wherein the voltage controlled oscillation module comprises a plurality of voltage controlled oscillators connected in series.

10. The clock generator as claimed in claim 1, wherein the logic control circuit comprises:
   a first transfer unit, arranging the first clocks in a first sequence, and outputting a first set of output clocks;
   a second transfer unit, arranging the first clocks in a second sequence, and outputting a second set of output clocks; and
   a logic unit, enabling the first transfer unit or the second transfer unit to selectively output the first set of output clocks or the second set of output clocks to serve as the set of corresponding clocks, according to the binary code.

11. The clock generator as claimed in claim 1, wherein the voltage controlled oscillation module is built in a phase-locked loop (PLL).

12. The clock generator as claimed in claim 5, further comprising an output control circuit selectively outputting the second clock from the clock synthesizer, the third clock and the fourth clock.

13. A phase-locked loop, comprising:
   a voltage controlled oscillation module, generating a plurality of first clocks ($D_0 \sim D_m$) with a first frequency (f0), wherein the first clocks $D_i$ and $D_{i-1}$ have a fixed phase difference and 1<i<m;
   a logic control circuit, outputting a set of corresponding clocks arranged by a corresponding sequence according to the first clocks and a binary code;
   a clock synthesizer generating a second clock with a second frequency (f1) according to the set of corresponding clocks, wherein $$f1 = \frac{A}{B}f2,$$

A<B and A and B are positive integers;
   a phase-frequency detector generating a control signal according to a phase difference between the second clock and a reference clock; and
   a charge pump receiving the control signal and generating a control voltage by a low pass filter to control the voltage controlled oscillation module.

14. The phase-locked loop as claimed in claim 13, wherein the decimal value of the binary code equals B.

15. The phase-locked loop as claimed in claim 14, wherein B is odd integer and B>1.

16. The phase-locked loop as claimed in claim 14, wherein B is even integer excluding from $2^N$ and N is positive integer and N>1.

17. The phase-locked loop as claimed in claim 13, further comprising a frequency divider receiving the second clock and one of the first clocks selectively and generating a third clock with a third frequency (f2), wherein $$f2 = \frac{1}{2^N}f0,$$

N is positive integer and N>1.

18. The phase-locked loop as claimed in claim 17, wherein the frequency divider generates a fourth clock with a fourth frequency (f3) when receiving one of the first clocks, $$f3 = \frac{1}{2^N}f0,$$

N is positive integer and N>1.

19. The phase-locked loop as claimed in claim 17, wherein the frequency divider comprise at lease one true single phase circuit (TSPC).

20. The phase-locked loop as claimed in claim 18, wherein the frequency divider receives one of the first clocks to generate the fourth clock when the decimal value of the binary code equals $2^N$.

21. The phase-locked loop as claimed in claim 13, wherein the clock synthesizer comprises:
   a plurality of D flip-flops connected in series, comprising a plurality of input terminals coupled to the corresponding clocks to generate a plurality of trigger pulses in sequence; and
   a clock generation unit outputting the second clock with the second frequency according to the trigger pulses.

22. The phase-locked loop as claimed in claim 13, wherein the voltage controlled oscillation module comprises a plurality of voltage controlled oscillators connected in series.

23. The phase-locked loop as claimed in claim 13, wherein the logic control circuit comprises:
   a first transfer unit, arranging the first clocks in a first sequence, and outputting a first set of output clocks;
   a second transfer unit, arranging the first clocks in a second sequence, and outputting a second set of output clocks; and
   a logic unit, enabling the first transfer unit or the second transfer unit selectively to output the first set of output clocks or the second set of the output clock to serve as the set of corresponding clocks, according to the binary code.

24. The phase-locked loop as claimed in claim 17, further comprising an output control circuit selectively outputting the second clock from the clock synthesizer, the third clock and the fourth clock.

25. A clock generation method, comprising:
   generating a plurality of first clocks ($D_0 \sim D_m$) with a first frequency (f0), wherein the first clocks $D_i$ and $D_{i-1}$ have a fixed phase difference and 1<i<m;
   outputting a set of corresponding clocks arranged by a corresponding sequence according to the first clocks and a binary code;
   synthesizing a second clock with a second frequency (f1) according to the set of corresponding clocks, wherein $$f1 = \frac{A}{B}f0,$$

A<B and A and B are positive integers, and receiving the second clock and one of the first clocks selectively and generating a third clock with a third frequency (f2), wherein $$f2 = \frac{1}{2^N} f0,$$

N is a positive integer and N>1.

26. The method as claimed in claim 25, wherein the first clocks $D_1$~$D_m$ is generated by a voltage controlled oscillation module or a phase-locked loop (PLL).

* * * * *